(12) United States Patent
Collins et al.

(10) Patent No.: US 10,879,113 B2
(45) Date of Patent: Dec. 29, 2020

(54) SEMICONDUCTOR CONSTRUCTIONS; AND METHODS FOR PROVIDING ELECTRICALLY CONDUCTIVE MATERIAL WITHIN OPENINGS

(71) Applicant: Micron Technology, Inc., Boise, ID (US)

(72) Inventors: Dale W. Collins, Boise, ID (US); Joe Lindgren, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 16/103,012

(22) Filed: Aug. 14, 2018

(65) Prior Publication Data

US 2018/0374745 A1 Dec. 27, 2018

Related U.S. Application Data

(62) Division of application No. 14/930,524, filed on Nov. 2, 2015, now Pat. No. 10,121,697, which is a division
(Continued)

(51) Int. Cl.
*H01L 21/768* (2006.01)
*H01L 21/285* (2006.01)
*H01L 23/532* (2006.01)

(52) U.S. Cl.
CPC .... *H01L 21/76843* (2013.01); *H01L 21/2855* (2013.01); *H01L 21/28556* (2013.01);
(Continued)

(58) Field of Classification Search
CPC .......... H01L 21/76856; H01L 21/2855; H01L 21/76843; H01L 21/768; H01L 21/28562;
(Continued)

(56) References Cited

U.S. PATENT DOCUMENTS 5,686,760 A   11/1997   Miyakawa
5,891,803 A   4/1999   Gardner
(Continued)

FOREIGN PATENT DOCUMENTS

CN   1272224   11/2000
CN   101174608   5/2008
(Continued)

OTHER PUBLICATIONS

Radisic et al., "Electrochemical Nucleation and Growth of Copper on Resistive Substrates", Electrochemical Society Program on Electrodeposition of Nanoengineered Materials and Alloys, Oct. 9, 2007, United States, p. 1375.

*Primary Examiner* — Mohsen Ahmadi
(74) *Attorney, Agent, or Firm* — Wells St. John P.S.

(57) ABSTRACT

Some embodiments include methods for depositing copper-containing material utilizing physical vapor deposition of the copper-containing material while keeping a temperature of the deposited copper-containing material at greater than 100° C. Some embodiments include methods in which openings are lined with a metal-containing composition, copper-containing material is physical vapor deposited over the metal-containing composition while a temperature of the copper-containing material is no greater than about 0° C., and the copper-containing material is then annealed while the copper-containing material is at a temperature in a range of from about 180° C. to about 250° C. Some embodiments include methods in which openings are lined with a composition containing metal and nitrogen, and the lined openings are at least partially filled with copper-containing material. Some embodiments include semiconductor constructions having a metal nitride liner along sidewall peripheries of an opening, and having copper-containing material
(Continued)

within the opening and directly against the metal nitride liner.

11 Claims, 9 Drawing Sheets

Related U.S. Application Data of application No. 12/860,745, filed on Aug. 20, 2010, now Pat. No. 9,177,917.

(52) U.S. Cl.
CPC .. *H01L 21/76856* (2013.01); *H01L 21/76882* (2013.01); *H01L 23/53238* (2013.01); *H01L 21/28562* (2013.01); *H01L 21/768* (2013.01); *H01L 21/76846* (2013.01); *H01L 21/76873* (2013.01); *H01L 21/76877* (2013.01); *H01L 2924/0002* (2013.01)

(58) Field of Classification Search
CPC ......... H01L 21/76882; H01L 23/53238; H01L 21/76849; H01L 21/76877; H01L 21/76873; H01L 21/76846
See application file for complete search history.

(56) References Cited

U.S. PATENT DOCUMENTS

| | | | |
|---|---|---|---|
| 5,903,053 A | 5/1999 | Iijima et al. | |
| 6,090,701 A | 7/2000 | Hasunuma et al. | |
| 6,399,512 B1 | 6/2002 | Blosse et al. | |
| 6,433,402 B1* | 8/2002 | Woo | H01L 21/76843 257/501 |
| 6,475,900 B2 | 11/2002 | Lee | |
| 6,790,774 B2 | 9/2004 | Fujikawa et al. | |
| 6,958,247 B2* | 10/2005 | Marxsen | H01L 21/2885 257/E21.175 |
| 7,192,495 B1* | 3/2007 | Collins | H01L 21/2885 148/518 |
| 7,625,815 B2 | 12/2009 | Yang | |
| 7,858,525 B2* | 12/2010 | Dominguez | H01L 21/76873 438/687 |
| 7,973,189 B2* | 7/2011 | Gordon | C23C 16/45553 556/138 |
| 8,310,052 B2 | 11/2012 | Torazawa | |
| 8,517,769 B1 | 8/2013 | Lin et al. | |
| 8,916,232 B2* | 12/2014 | Yoon | C23C 18/1632 427/97.7 |
| 2001/0041440 A1 | 11/2001 | Endo et al. | |
| 2002/0190352 A1 | 12/2002 | Kishida et al. | |
| 2003/0157799 A1 | 8/2003 | Ding et al. | |
| 2004/0014312 A1* | 1/2004 | Kunishima | H01L 21/76874 438/637 |
| 2004/0198055 A1* | 10/2004 | Wang | H01L 21/76877 438/692 |
| 2006/0014382 A1 | 1/2006 | Lee | |
| 2006/0027932 A1 | 2/2006 | Yu et al. | |
| 2006/0046454 A1* | 3/2006 | Collins | H01L 21/288 438/597 |
| 2006/0065896 A1 | 3/2006 | Antol et al. | |
| 2006/0240187 A1* | 10/2006 | Weidman | C23C 16/18 427/248.1 |
| 2006/0249849 A1* | 11/2006 | Cohen | H01L 21/76873 257/758 |
| 2006/0251872 A1* | 11/2006 | Wang | B32B 15/018 428/209 |
| 2007/0048932 A1* | 3/2007 | Collins | H01L 21/76852 438/253 |
| 2007/0052096 A1 | 3/2007 | Su et al. | |
| 2007/0292603 A1 | 12/2007 | Dordi et al. | |
| 2008/0102599 A1 | 5/2008 | Yang | |
| 2008/0132050 A1* | 6/2008 | Lavoie | C23C 14/0084 438/584 |
| 2008/0203570 A1 | 8/2008 | Edelstein et al. | |
| 2008/0206982 A1 | 8/2008 | Suzuki | |
| 2008/0296768 A1 | 12/2008 | Chebiam et al. | |
| 2009/0017621 A1 | 1/2009 | Sako et al. | |
| 2009/0045519 A1 | 2/2009 | Kamikubo | |
| 2009/0209101 A1 | 8/2009 | Shinriki et al. | |
| 2009/0280649 A1* | 11/2009 | Mayer | B23H 5/08 438/676 |
| 2010/0327446 A1* | 12/2010 | Yang | H01L 21/76846 257/751 |
| 2011/0175226 A1* | 7/2011 | Bonilla | H01L 21/76847 257/751 |
| 2011/0204518 A1 | 8/2011 | Arunachalam | |

FOREIGN PATENT DOCUMENTS

| | | |
|---|---|---|
| CN | 201180040193.8 | 12/2014 |
| CN | 201180040193.8 | 6/2015 |
| JP | 08-139092 | 5/1996 |
| JP | 08-148560 | 6/1996 |
| JP | H08-316233 | 11/1996 |
| JP | 11-054612 | 2/1999 |
| JP | 11-186273 | 7/1999 |
| JP | H11-186573 | 7/1999 |
| JP | H11-260820 | 9/1999 |
| JP | 2001-007049 | 1/2001 |
| JP | 2001-007050 | 1/2001 |
| JP | 2001-250829 | 9/2001 |
| JP | 2001-264358 | 10/2001 |
| JP | 2001-284358 | 10/2001 |
| JP | 2009-016520 | 1/2008 |
| JP | 2008-071850 | 3/2008 |
| JP | 2008-141051 | 6/2008 |
| JP | 2009-105289 | 5/2009 |
| JP | 2010-153487 | 7/2010 |
| TW | 100128399 | 10/2013 |
| WO | WO 99/17358 | 4/1999 |
| WO | WO 2009/054268 | 4/2009 |
| WO | PCT/US2011/045067 | 2/2012 |
| WO | PCT/US2011/045067 | 3/2013 |

* cited by examiner

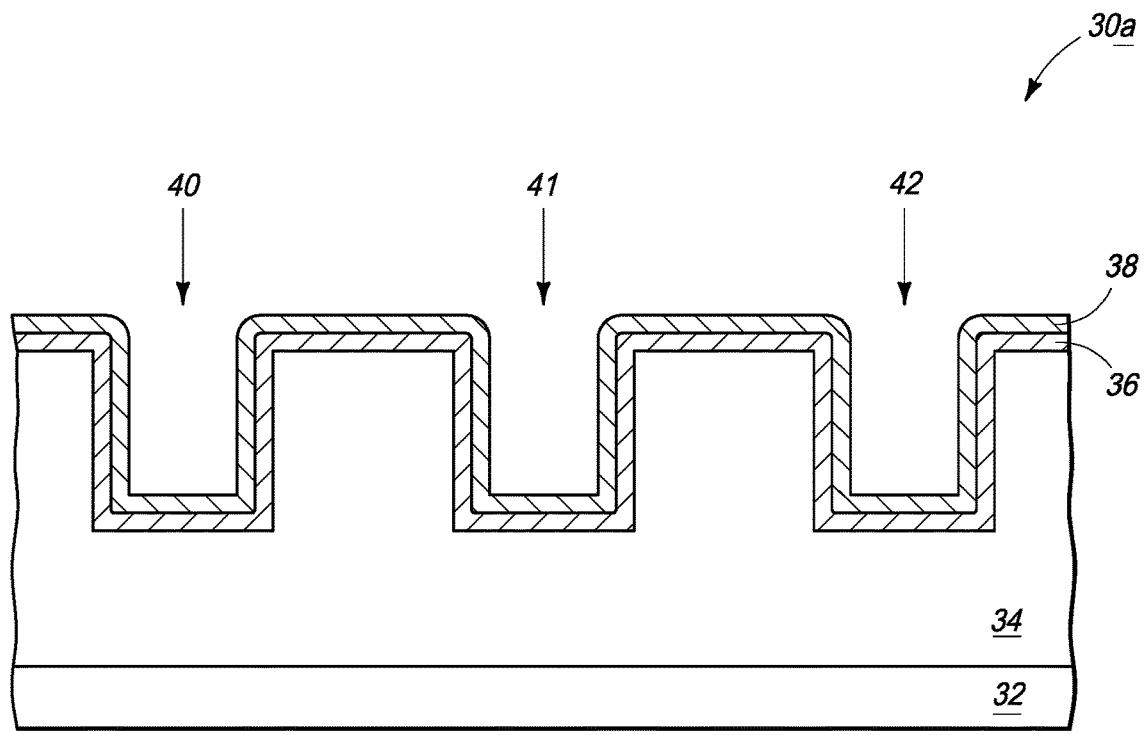
_Fig. 10_
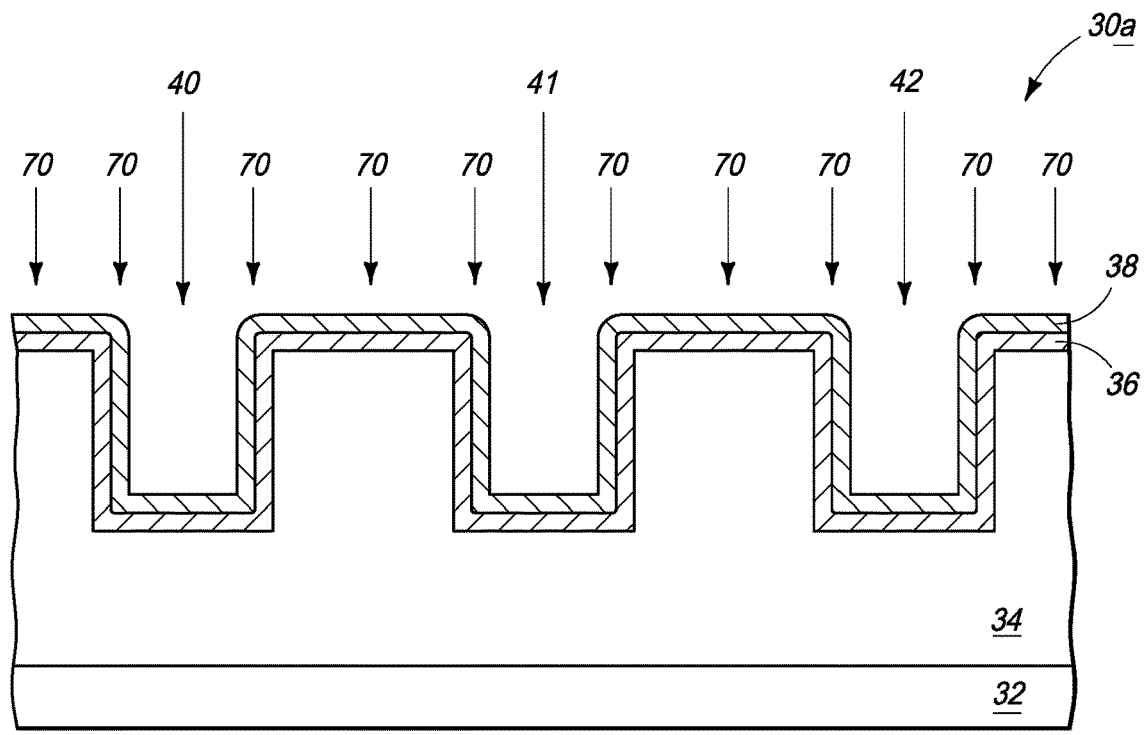
_Fig. 11_

SEMICONDUCTOR CONSTRUCTIONS; AND METHODS FOR PROVIDING ELECTRICALLY CONDUCTIVE MATERIAL WITHIN OPENINGS

RELATED PATENT DATA

This patent resulted from a divisional of U.S. patent application Ser. No. 14/930,524 which was filed Nov. 2, 2015, which is a divisional application of U.S. patent application Ser. No. 12/860,745, which was filed Aug. 20, 2010, each of which is hereby incorporated by reference herein.

TECHNICAL FIELD

Semiconductor constructions; and methods for providing electrically conductive material within openings.

BACKGROUND

The fabrication of integrated circuitry may involve formation of electrically conductive lines across a semiconductor substrate. A damascene process may be utilized to form such lines. FIGS. 1-3 illustrate an example prior art damascene process.

Referring to FIG. 1, a semiconductor construction 10 comprises a base 12, and an electrically insulative material 14 formed over the base. The base may comprise monocrystalline silicon. The insulative material 14 may comprise, for example, one or more of silicon dioxide, silicon nitride, and any of various doped silicon oxides (for instance, borophosphosilicate glass (BPSG), phosphosilicate glass (PSG), fluorosilicate glass (FSG), etc.). The insulative material 14 may be homogeneous, as shown, or may comprise multiple materials in discrete layers.

A plurality of openings 16-18 are formed to extend into material 14. The openings may be formed by utilizing a patterned photoresist mask (not shown) to define locations of the openings, utilizing one or more etches to extend the openings into such locations, and then removing the photoresist mask to leave the structure shown in FIG. 1.

Referring to FIG. 2, materials 20 and 22 are provided within the openings to line the openings, and then the lined openings are filled with copper 24.

The material 20 may comprise titanium nitride, tantalum nitride, tantalum/ruthenium, tantalum, or titanium oxide, and may function as a barrier to block copper diffusion.

The material 22 may, for example, comprise ruthenium and nitrogen, or as another example may consist of ruthenium. The material 22 may be utilized as a stratum to adhere the subsequently deposited copper 24.

Referring to FIG. 3, construction 10 is subjected to a polishing process (for instance, chemical-mechanical polishing) to form a plurality of electrically isolated conductive lines 25-27 from the materials 20, 22 and 24 within the openings 16-18.

The conductive lines 25-27 shown in FIG. 3 are idealized, in that the copper 24 completely and substantially uniformly fills each of the openings 16-18. In practice, difficulties may be encountered in attempting to substantially uniformly fill the openings with the copper; particularly as the openings become increasingly narrow with higher levels of integration.

FIG. 4 illustrates a problem that may occur during the formation of copper 24 within the openings 16-18. Specifically, the copper is not uniformly deposited within the openings, and accordingly voids 28 are formed in some of the openings. The voids may be of different sizes, as shown, and accordingly the conductivity of various conductive lines ultimately formed within the openings will vary from one line to another. Such non-uniformity of conductivity may impair, or destroy, the operability and/or reliability of an integrated circuit comprising such conductive lines. Accordingly, it is desired to develop improved methods for fabrication of electrically conductive lines.

BRIEF DESCRIPTION OF THE DRAWINGS

FIGS. 10-13 are diagrammatic cross-sectional views of a portion of a semiconductor wafer shown at various stages of another example embodiment fabrication process.

DETAILED DESCRIPTION OF THE ILLUSTRATED EMBODIMENTS

In some embodiments copper is utilized to fill narrow openings. The copper may be subjected to conditions which create enough mobility (for instance, surface diffusion) within the copper to enable the copper to flow into the openings. In particular embodiments, the openings may be narrow enough to create capillary forces which assist in bringing the copper into the openings. A balance may be struck relative to the mobility of the copper (which may be, for example, a surface transport type mechanism) so that the copper is dynamic enough to flow into the openings, but is sufficiently static (or bound) to avoid agglomeration.

Some example embodiments are described with reference to FIGS. 5-16.

Figure 5:
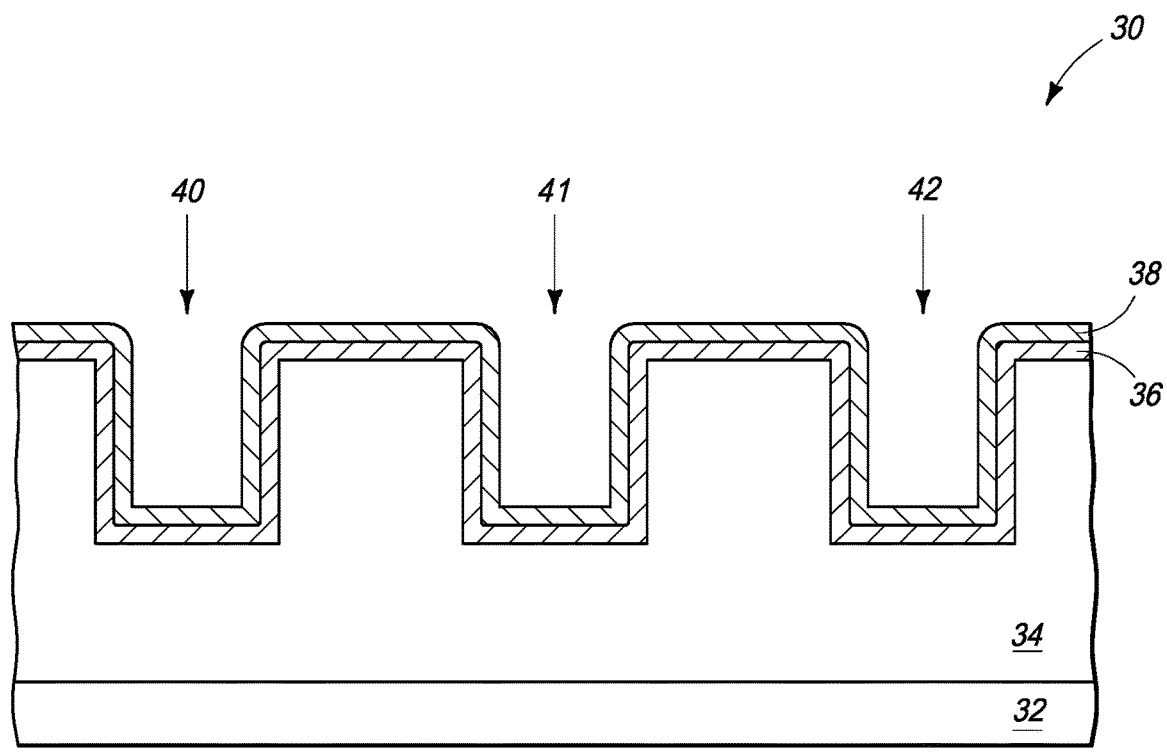
FIGS. 5-8 are diagrammatic cross-sectional views of a portion of a semiconductor wafer shown at various stages of an example embodiment fabrication process.

Referring to FIG. 5, a semiconductor construction 30 is shown to comprise a base 32, and an electrically insulative 34 over the base. The base 32 and electrically insulative material 34 may comprise the same compositions as discussed above relative to the base 12, and electrically insulative 14, respectively.

In some embodiments base 32 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 32 is shown to be homogenous, the base may comprise numerous layers in some embodiments. For instance, base 32 may correspond to a semiconductor substrate containing one or more layers associated with integrated circuit fabrication. In such embodiments, such layers may correspond to one or more of refractory metal layers, barrier layers, diffusion layers, insulator layers, etc.

Figure 1:
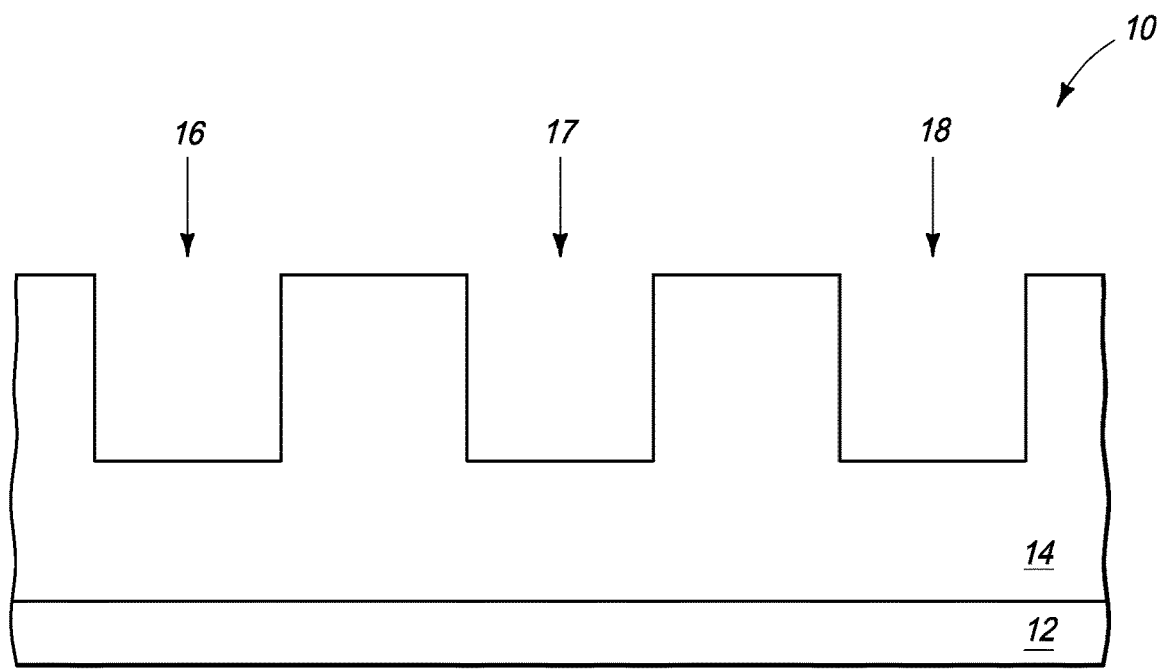
FIGS. 1-3 are diagrammatic cross-sectional views of a portion of a semiconductor wafer at various stages of a prior art fabrication process.

Openings 40-42 extend into the electrically insulative material 34. Such openings may be formed utilizing the same processing discussed above with reference to FIG. 1 for forming openings 16-18.

Figure 2:
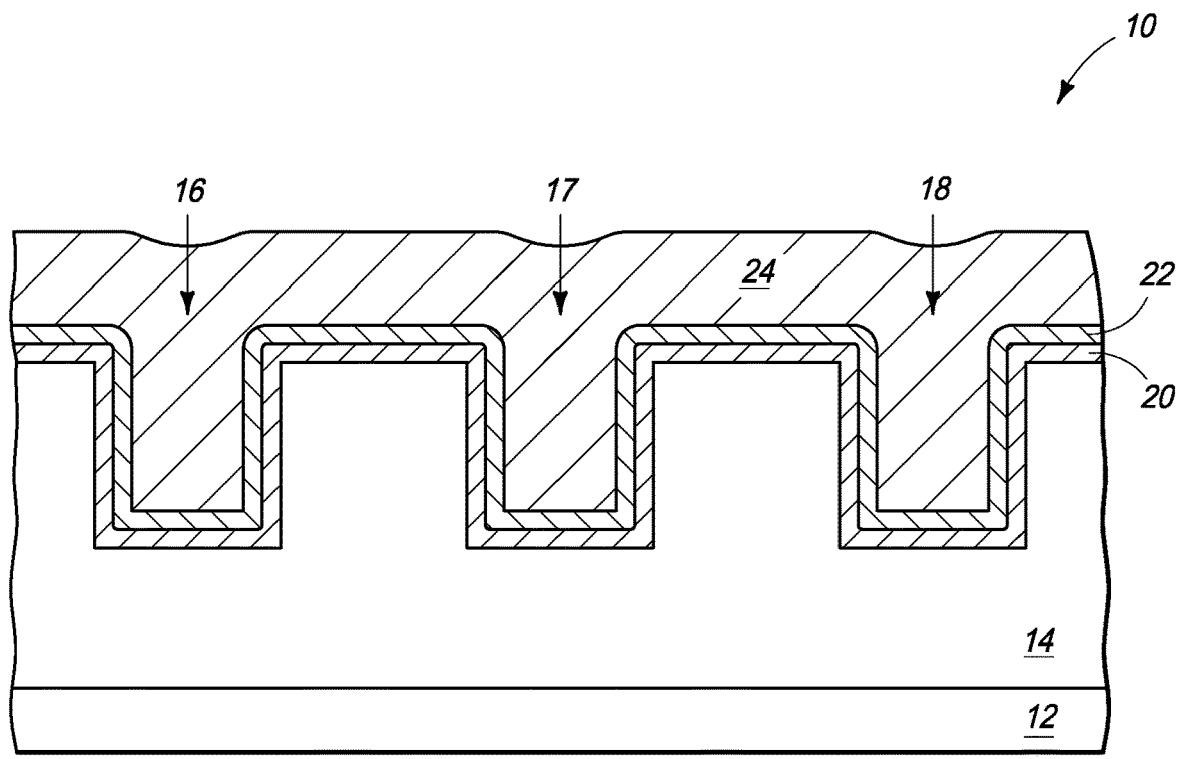
Figure 3:
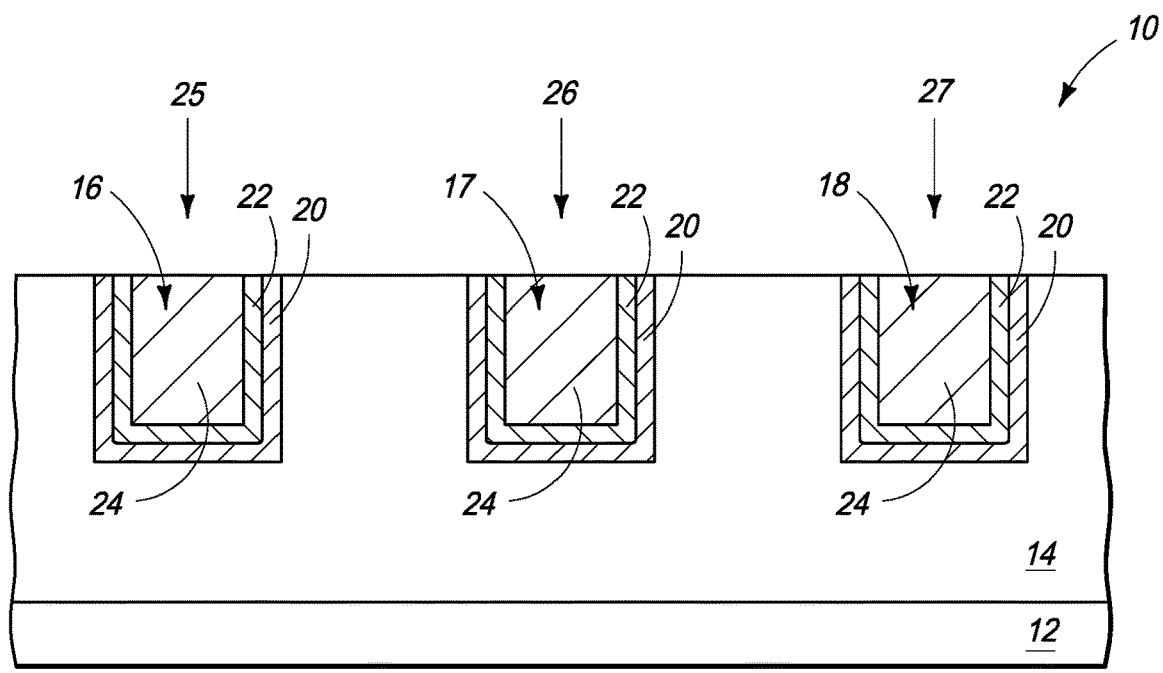
Figure 4:
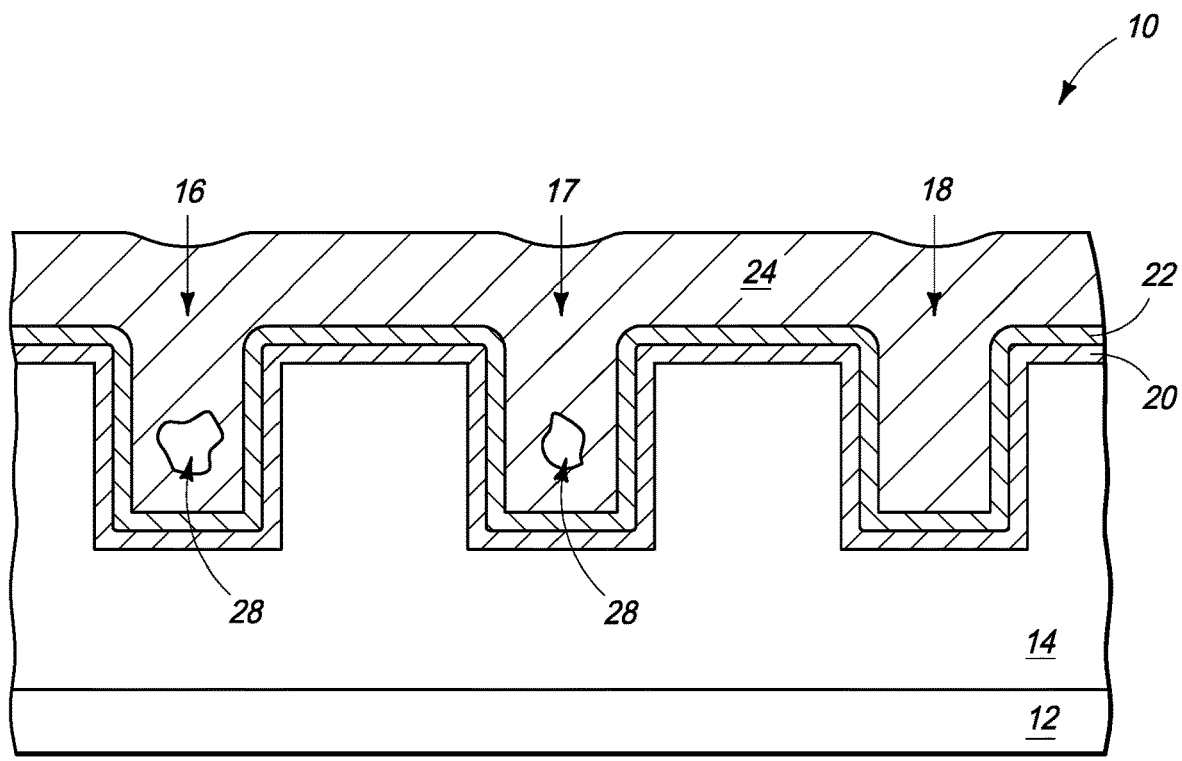
FIG. 4 is a diagrammatic cross-sectional view of a portion of a semiconductor wafer showing a problem that may occur in some prior art processes.

A barrier material 36 is optionally provided within the openings to line the openings. The barrier material may comprise any of the compositions discussed above with reference to the barrier material 20 of FIG. 2.

A liner 38 is provided over barrier material 36. The liner 38 is a metal-containing material comprising one or both of ruthenium and cobalt. In some embodiments the liner may consist essentially of, or consist of one or both of ruthenium and cobalt. In other embodiments the liner may comprise one or more transition metals alloyed with one or both of ruthenium and cobalt; and may, for example, comprise, consist essentially of, or consist of tantalum alloyed with one or both of ruthenium and cobalt. In some embodiments the liner may comprise nitrogen in combination with one or both of ruthenium and cobalt.

Figure 6:
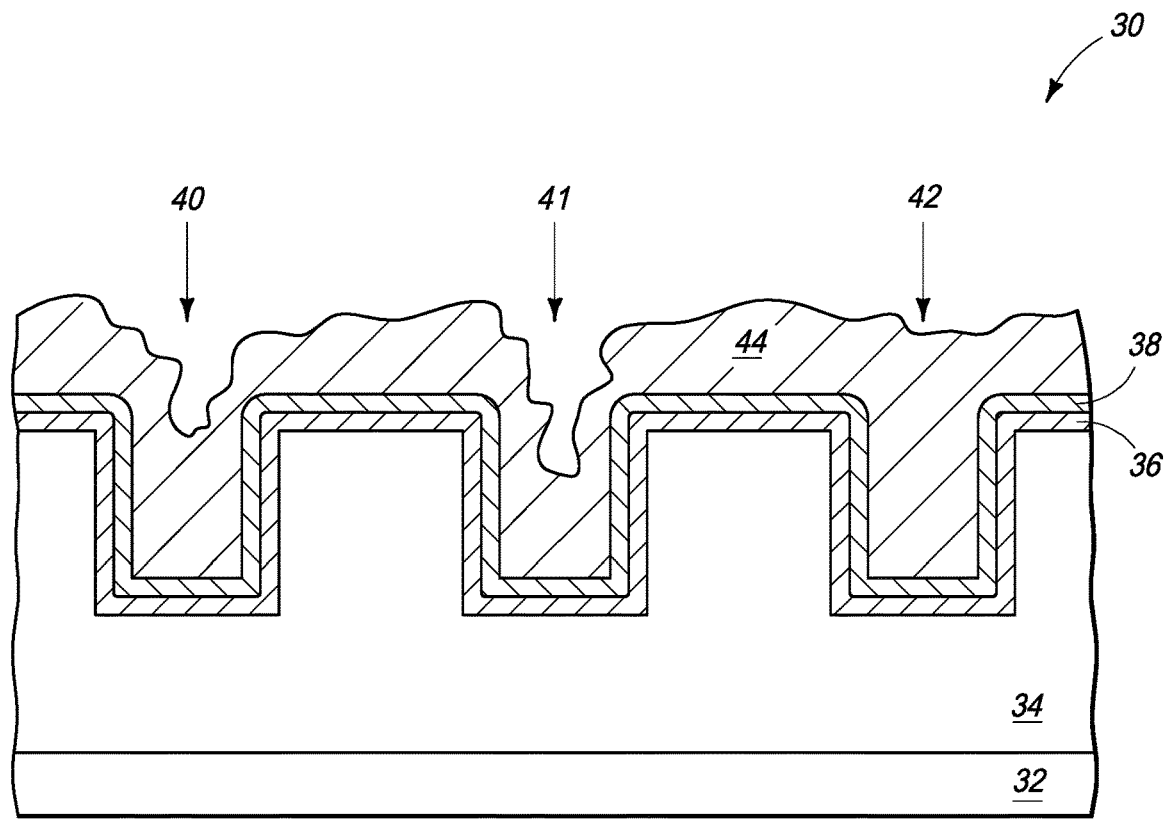

Referring to FIG. 6, copper-containing material 44 is deposited across construction 30 and within openings 40-42. The copper-containing material may comprise, consist essentially of, or consist of copper. The copper-containing material is shown deposited under conditions which form the material to have a conformation that less than uniformly fills openings 40-42, and which leaves voids and/or recesses in some of the openings (specifically, openings 40 and 41 in the illustrated embodiment). In some embodiments the copper-containing material 44 may be considered to be a copper-containing coating at the processing stage of FIG. 6, with such coating non-uniformly filling openings 40-42.

The copper-containing material is preferably deposited under conditions which maintain small grain sizes (specifically, grain sizes less than or equal to about one-fourth pitch) within such material to avoid undesired surface roughness. For instance, the copper-containing material may be physical vapor deposited while maintaining a temperature of the construction 30 and the deposited copper-containing material at less than or equal to about 40° C. The physical vapor depositing may utilize any appropriate technique for sputtering copper from a target, such as, for example, utilization of a self-ionizing plasma. The physical vapor depositing may be conducted under suitable conditions, and for a suitable duration, to form a contiguous layer of copper-containing material 44 across an upper surface of construction 30.

Figure 7:
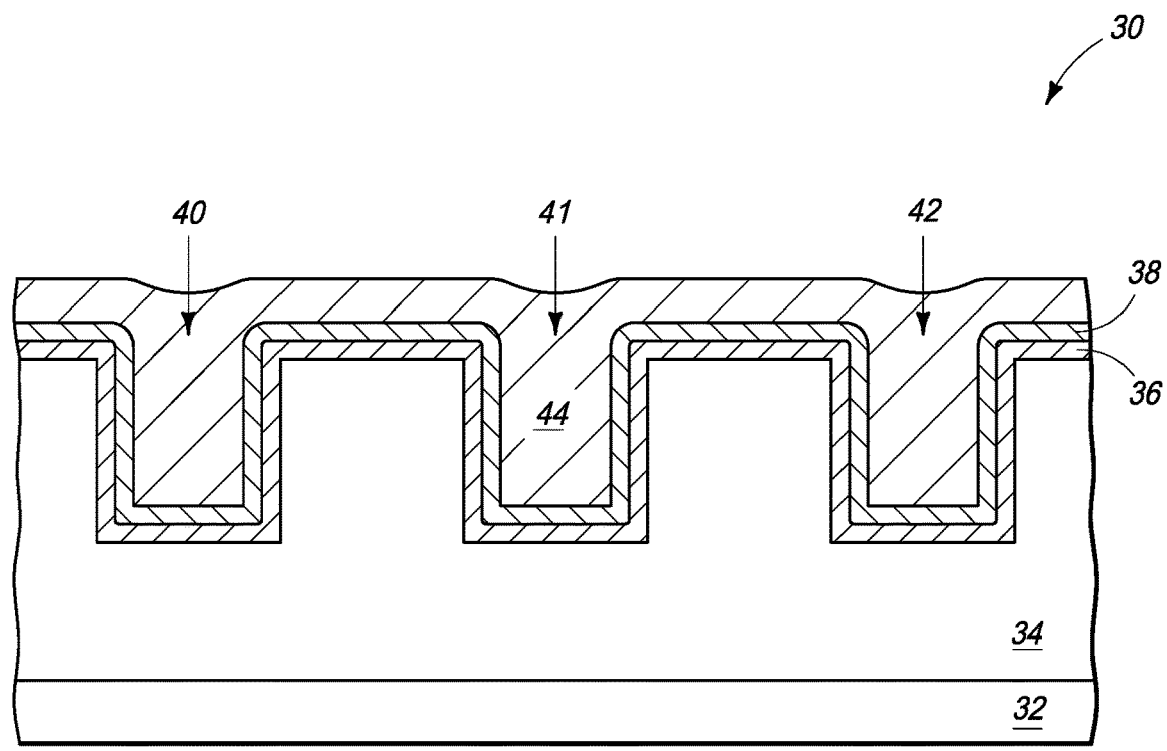

Referring to FIG. 7, the copper-containing material 44 may be subjected to thermal conditions which enable the material to reflow across construction 30, and to thereby substantially uniformly fill openings 40-42 with the copper-containing material. The thermal treatment of the copper-containing material may be an anneal which takes the copper-containing material to a temperature within a range of from about 180° C. to about 600° C. (in some embodiments within a range of from about 180° C. to about 450° C., and in some embodiments within a range of from about 350° C. to about 450° C.), and which maintains the copper-containing material at such temperature for a suitable duration to enable the copper-containing material to reflow into the openings. An example duration may be from at least about 1 second to less than or equal to about 30 seconds (for instance, about 20 seconds). The reflowed copper may be considered to adopt a second conformation which is more uniform within openings 40-42 than the first conformation of FIG. 6. Specifically, the voids (or recesses) within openings 40 and 41 of FIG. 6 are expelled from the openings as the copper-containing material reflows to fill the openings.

Although FIGS. 6 and 7 describe an embodiment in which a single deposition/anneal sequence fills the openings 40-42 to desired uniformity, in other embodiments there may be two or more deposition/anneal sequences conducted in order to fill the openings to the desired uniformity. Thus, the processing of FIGS. 6 and 7 may be consider a single iteration of a process sequence, and such iteration may be repeated as many times as appropriate to form a copper-containing material to a desired thickness and uniformity. In some embodiments, at least one iteration may vary in temperature, time, and/or one or more other conditions relative to at least one other iteration. In embodiments that utilize two or more deposition/anneal sequences the copper-containing material on a substrate may be maintained in a temperature range of from about 180° C. to about 250° C.

An advantage of the processing of FIGS. 5-7 is that such processing may become increasingly effective for filling openings as the openings become narrower. Specifically, the processing may take advantage of capillary forces within narrow openings to assist in drawing the reflowing copper-containing material into the openings. Thus, in addition to being useful for filling the narrow openings of present processes of semiconductor fabrication, the methodology of FIGS. 5-7 may be readily applied for filling narrower openings utilized in future processes having higher levels of integration than current processes.

Figure 8:
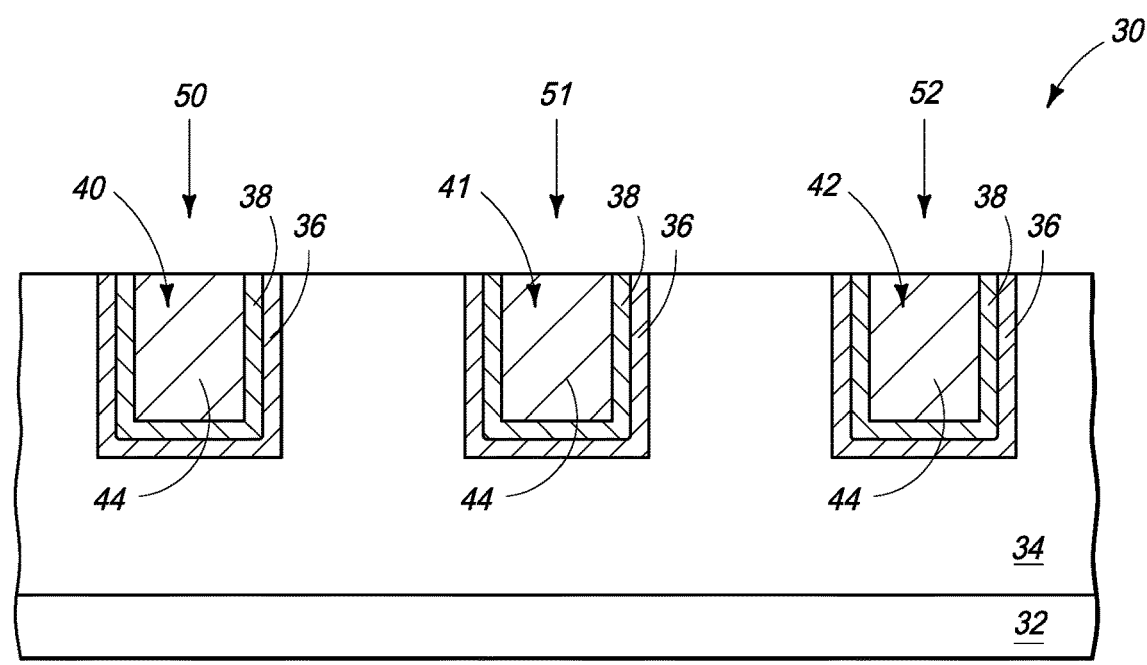

Referring to FIG. 8, construction 30 is subjected to planarization to form electrically conductive lines 50-52 from the conductive materials 36, 38 and 44 within the openings 40-42. The planarization may comprise any suitable processing; such as, for example, chemical-mechanical polishing (CMP).

Although the example processing of FIGS. 5-8 utilizes separate thermal conditions for the deposition of the copper-containing material (FIG. 6) and the anneal of the copper-containing material (FIG. 7), in other embodiments the deposition may be conducted under thermal conditions hot enough to simultaneously accomplish the anneal. For instance, the deposition of the copper-containing material may be conducted under conditions which maintain a temperature of the deposited copper-containing material at greater than 100° C. In some embodiments such temperature of the deposited copper-containing material may be in a range of from about 180° C. to about 600° C.; and in particular embodiments may be in a range of from about 300° C. to about 600° C., in a range of from about 300° C. to about 450° C., or in a range of from about 500° C. to about 600° C. The deposition temperature (i.e., the temperature of the deposited copper; which may be controlled by controlling a temperature of the substrate that the copper is deposited onto) may be maintained at a suitable level to maintain suitable surface mobility within the copper-containing material to obtain desired reflow of the copper-containing material without inducing agglomeration of the material.

If the deposition is conducted under sufficiently high temperatures, the separate anneal of FIG. 7 may be omitted. Instead, the copper-containing material may simultaneously deposit and reflow so that the material forms the desired uniform conformation.

In some embodiments the high temperature deposition/anneal (i.e., the deposition/anneal at the temperature greater than 100° C.) may be conducted to form copper directly on a liner (such as the liner 38 of FIG. 5). In other embodiments a thin copper seed layer may first be formed over the liner under low temperature conditions (for instance, in some embodiments at conditions having a temperature of the deposited copper at less than or equal to 0° C.), and then the high temperature deposition/anneal may be conducted to form copper on the copper seed layer.

In some embodiments the deposition of the copper-containing material is conducted with intermittent plasma pulses to achieve substantially uniform filling of trenches or other cavities. Specifically, the copper-containing material is sputter-deposited at a suitable temperature of the deposited material (for instance, about 400° C.) utilizing plasma; and then the plasma is extinguished (i.e., "killed") while maintaining suitable high temperature of the deposited copper-containing material for a sufficient duration of time (for instance, about 15 seconds) to allow the copper-containing material to surface diffuse into trenches, openings or other types of cavities. The surface diffusion can allow the copper to fill the cavities without pinching off (also referred to as "necking off") at the tops of the cavities. The pinching off at the tops of the cavities can form voids within the cavities, and the avoidance of the pinching off can thus alleviate, or even prevent, void formation. The sputter deposition and subsequent killing of the plasma may be considered a single iteration of a process for forming copper-containing material within cavities. Multiple iterations may be conducted to fill the cavities to a desired level.

A difficulty that may occur during high-temperature deposition of copper-containing material is that the material may have large grain sizes if the deposition occurs too quickly or too slowly. Such large grain sizes may interfere with the concurrent reflow of the copper-containing material and lead to an agglomeration of the copper-containing material, rather than uniform filling of openings 40-42. In some embodiments, the copper-containing material is deposited at a rate of from about 20 angstroms/second to about 50 angstroms/second, while maintaining a temperature within a deposition chamber in a range of from about 180° C. to about 450° C.

The deposition may be conducted utilizing any suitable process. An example process comprises sputtering material from a copper-containing target. In some embodiments it may be desirable to utilize a deposition process having a relatively slow rate of sputtering; with an example process being utilization of a noble gas (for instance argon) or another inert substance to sputter copper-containing material from a sputtering target.

Figure 9:
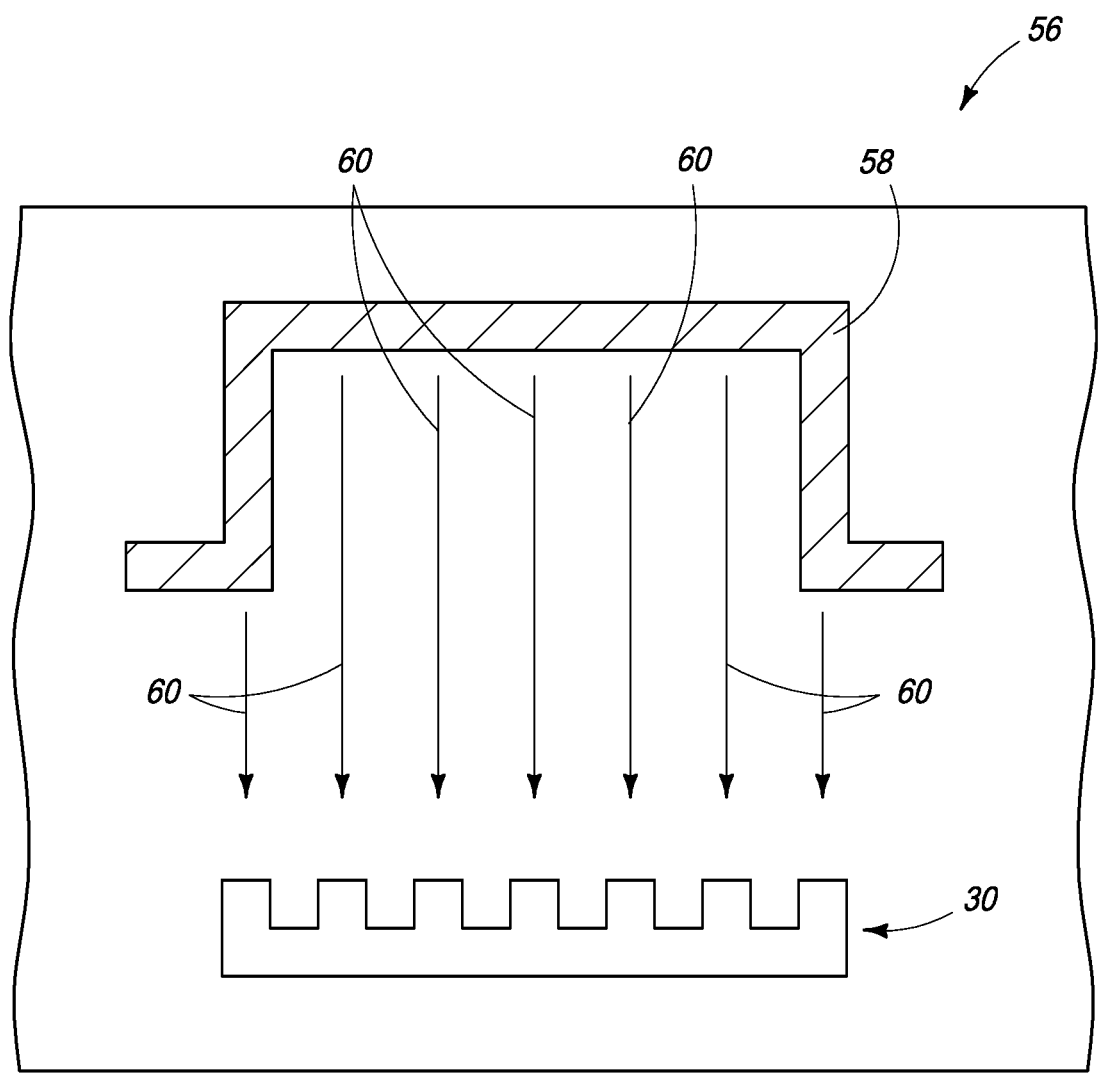
FIG. 9 is a diagrammatic cross-sectional view of material being physical vapor deposited onto a wafer in a reaction chamber.

FIG. 9 shows an example physical vapor deposition (PVD) apparatus 56 that may be utilized in some embodiments. A copper-containing target 58 is retained within a reaction chamber of the apparatus, and is provided over a semiconductor substrate 30. In operation, copper-containing material 60 is sputtered from the target, and such copper-containing material is deposited over an upper surface of the substrate 30. The sputtering of copper-containing material 60 from the target may be accomplished with any of numerous technologies, including, for example, utilization of self-ionizing plasma to displace material from the target and/or utilization of an inert gas to displace material from the target. Temperature control equipment (not shown) may be provided around the reaction chamber to enable control of a temperature of the deposited copper-containing material; and a temperature controlled chuck may be utilized to support substrate 30 so that a temperature of substrate 30 may be accurately controlled during the PVD process.

As discussed above with reference to FIG. 5, some embodiments include utilization of a metal nitride for liner 38. FIGS. 10-13 show an example embodiment for forming and utilizing a nitrogen-containing material for the liner.

Referring to FIG. 10, a semiconductor construction 30a is shown at a processing stage analogous to that of FIG. 5. The construction includes the base 32, insulative material 34, barrier layer 36 and liner 38. The liner 38 of FIG. 10 may comprise, consist essentially of, or consist of one or both of ruthenium and cobalt in some embodiments. In other embodiments, the liner 38 of FIG. 10 may comprise, consist essentially of, or consist of one or more transition metals (for instance tantalum) in combination with one or both of ruthenium and cobalt.

Referring to FIG. 11, liner 38 is exposed to a nitrogen-containing composition 70 to nitride the material of the liner. The nitrogen-containing composition 70 may be any suitable composition, and in some embodiments may comprise one or more of $NH_3$, $NH_2$, and $N_2$. In some embodiments the nitrogen-containing composition may be utilized in combination with another composition. For instance, $NH_3$ may be utilized in combination with $O_2$; and $N_2$ may be utilized in combination with $H_2$.

The nitriding of the material of the liner may convert some or all of the liner into a composition containing metal and nitrogen. In some embodiments the nitrided liner may contain nitrogen in combination with one or both of cobalt and ruthenium. In some embodiments the nitrided liner may contain nitrogen in combination with a transition metal (for instance tantalum) and one or both of cobalt and ruthenium.

Figure 12:
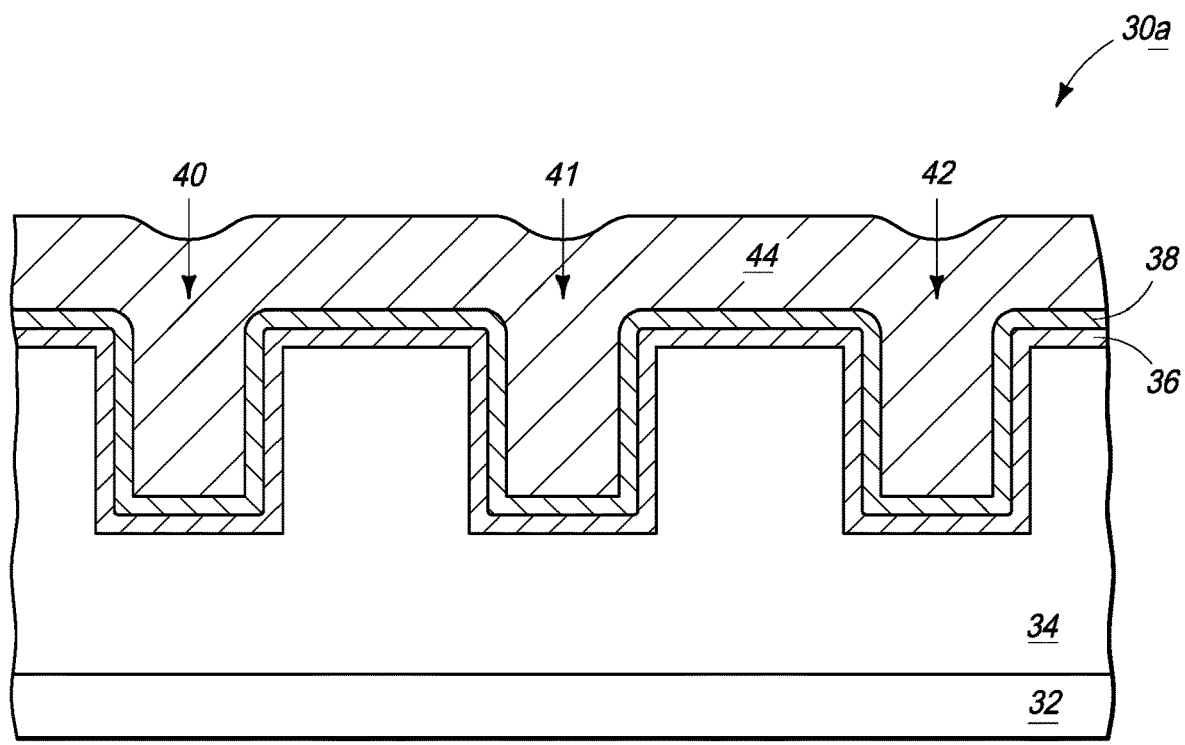

Referring to FIG. 12, copper-containing material 44 is deposited within openings 40-42. Such deposition may utilize any suitable method, and in some embodiments may utilize one of the methods discussed above with reference to FIGS. 5-9. The nitriding of the metal within liner 38 may be beneficial in achieving uniform reflow of copper into openings 40-42 in some embodiments.

Figure 13:
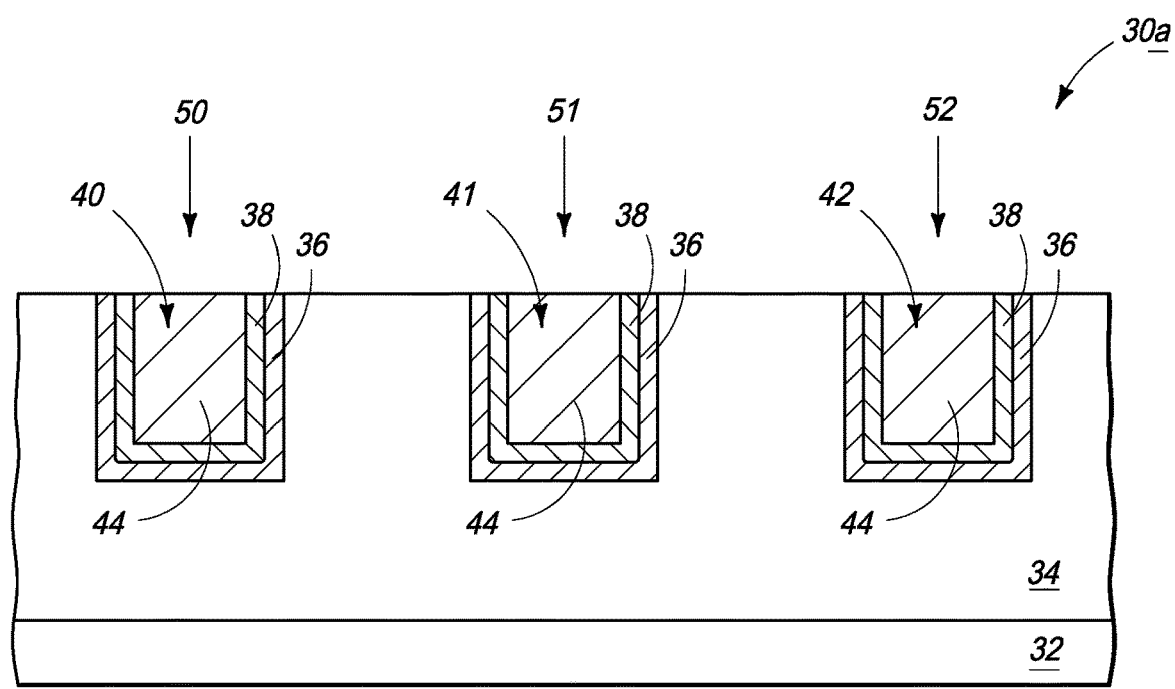

Referring to FIG. 13, construction 30a is subjected to planarization to form electrically separated lines 50-52. Each of such lines comprises copper-containing material 44 (which in some embodiments may consist of copper) directly against nitrogen-containing material 38 (which in some embodiments may consist of nitrogen in combination with one or both of ruthenium and cobalt; and in some embodiments may consist of nitrogen and one or more transition metals in combination with one or both of ruthenium and cobalt).

Although the nitrogen-containing liner of FIGS. 10-13 is described as being formed by exposing a metal-containing liner to nitrogen, in other embodiments the nitrogen-containing liner may be directly deposited utilizing one or more of ALD, CVD and PVD. For instance, the nitrogen-containing liner may comprise, consist essentially of, or consist of nitrogen in combination with one or both of ruthenium and cobalt, and may be directly deposited by ALD, CVD and/or PVD. In other embodiments, the nitrogen-containing liner may comprise, consist essentially of, or consist of nitrogen and one or more transition metals in combination with one or both of ruthenium and cobalt, and may be directly deposited by ALD, CVD and/or PVD.

In applications in which the liner 38 comprises one or more transition metals alloyed with one or both of ruthenium and cobalt, it may be desirable to omit the barrier 36. Specifically, the liner 38 may be able to achieve both of the functions of being a barrier to copper migration, and of being a stratum for retaining a copper-containing material.

Figure 14:
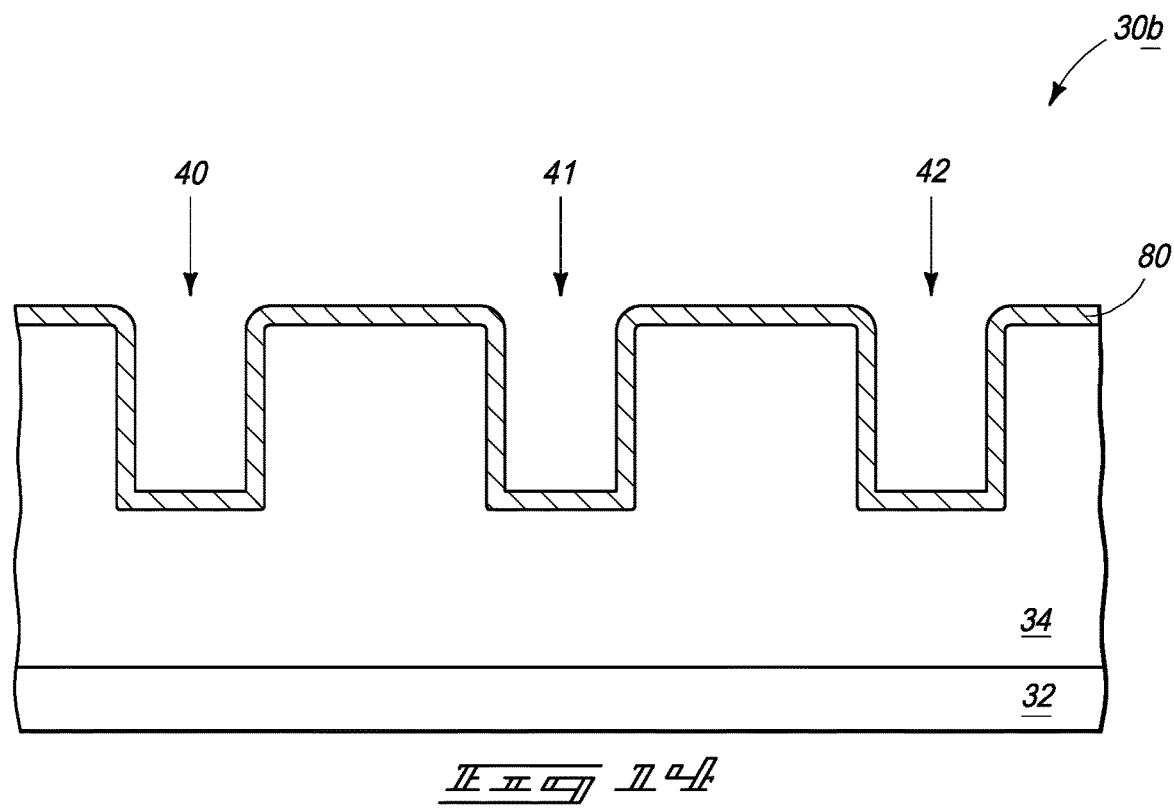
FIGS. 14-16 are diagrammatic cross-sectional views of a portion of a semiconductor wafer shown at various stages of another example embodiment fabrication process.
Figure 15:
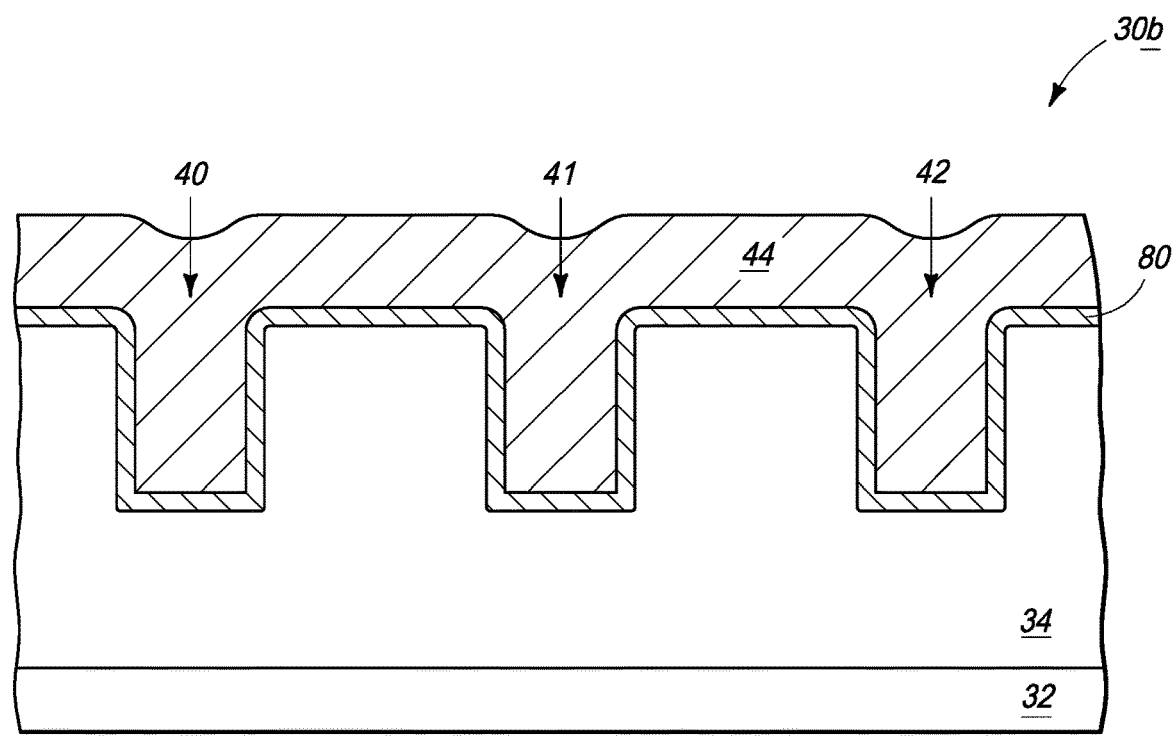
Figure 16:
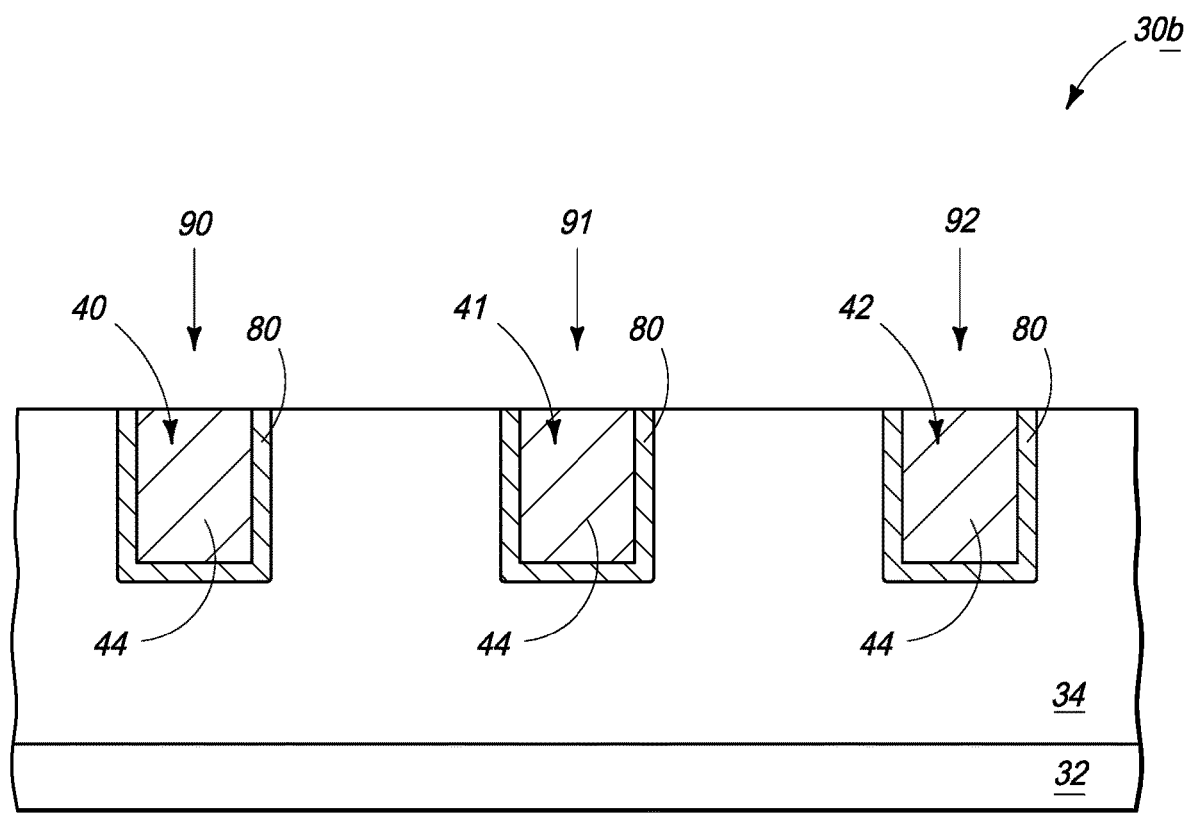

FIGS. 14-16 illustrate an example embodiment in which barrier 36 (FIG. 5) is omitted. FIG. 14 shows a semiconductor construction 30*b* at a processing stage analogous to that of FIG. 5. The construction 30*b* includes the base 32 and insulative material 34 discussed above with reference to FIG. 5. The openings 40-42 extend into the insulative material 34. A liner 80 extends across an upper surface of insulative material 34 and within openings 40-42, with such liner lining sidewalls of the openings. The liner 80 may comprise, consist essentially of, or consist of a transition metal (such as tantalum) alloyed with one or both of ruthenium and cobalt. In some embodiments the liner 80 may comprise, consist essentially of, or consist of nitrogen and one or more transition metals (for instance tantalum) in combination with one or both of ruthenium and cobalt.

The liner 80 is directly against electrically insulative material 34. In some embodiments, electrically insulative material 34 may be a silicon oxide-containing material (for instance, silicon dioxide, BPSG, PSG, FSG, etc.), and the liner 80 may be directly against such silicon oxide-containing material.

Referring to FIG. 15, copper-containing material 44 is deposited within openings 40-42. Such deposition may utilize any suitable method, and in some embodiments may utilize one of methods discussed above with reference to FIGS. 5-9.

Referring to FIG. 16, construction 30*b* is subjected to planarization to form electrically separated lines 90-92. Each of such lines comprises copper-containing material 44 directly against liner 80, which in turn is directly against electrically insulative material 34.

The embodiments discussed above may be utilized in forming integrated circuitry. Such circuitry may be used in electronic systems, such as, for example, computers, cars, airplanes, clocks, cellular phones, etc. In some applications, the embodiments described herein may be utilized for forming integrated memory, such as flash memory.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

When an element is referred to above as being "on" or "against" another element, it can be directly on the other element or intervening elements may also be present. In contrast, when an element is referred to as being "directly on" or "directly against" another element, there are no intervening elements present. When an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
an electrically insulative material directly on a surface of a monocrystalline base, the electrically insulative material comprising one or more materials selected from the group consisting of silicon dioxide, silicon nitride, borophosphosilicate glass, and phosphosilicate glass;
an opening extending only partially into the electrically insulative material, the opening having a pair of vertically opposing sidewalls that each meet a bottom of the opening, the bottom of the opening extending across the width of the opening and being disposed above the surface of the monocrystalline base;
a barrier material liner lining and in direct contact with the electrically insulative material along sidewalls and bottom of the opening, the barrier material comprising at least one of titanium, tantalum and ruthenium;
a metal liner material over and directly contacting the barrier material liner along the sidewalls and bottom of the opening, the metal liner material consisting of metal and comprising tantalum alloyed with cobalt; and
copper-containing material within the opening and directly against the metal liner material.

2. The construction of claim 1 wherein the metal liner material further comprises ruthenium.

3. The construction of claim 1 wherein the electrically insulative material comprises silicon dioxide material.

4. A semiconductor construction, comprising:
an electrically insulative material directly on a surface of a monocrystalline base;
an opening extending only partially into the electrically insulative material, the opening having a pair of vertically opposing sidewalls that each meet a bottom of the opening, the bottom of the opening extending across the width of the opening and being disposed above the surface of the monocrystalline base;
a barrier material liner lining and in direct contact with the electrically insulative material along sidewalls and bottom of the opening, the barrier material comprising at least one of titanium, tantalum and ruthenium;
a metal liner material over and directly contacting the barrier material liner along the sidewalls and bottom of the opening, the metal liner material consisting metal and comprising tantalum alloyed with cobalt; and
copper-containing material within the opening and directly against the metal liner material.

5. The construction of claim 4 wherein the metal liner material further comprises ruthenium.

6. The construction of claim 4 wherein the barrier material comprises titanium nitride.

7. The construction of claim 4 wherein the barrier material comprises tantalum nitride.

8. The construction of claim 4 wherein the barrier material comprises both tantalum and ruthenium.

9. The construction of claim 4 wherein the barrier material comprises titanium oxide.

10. The construction of claim 4 wherein the copper-containing material consists essentially of copper.

11. A semiconductor construction, comprising:
an electrically insulative material directly on a surface of a monocrystalline base;
an opening extending only partially into the electrically insulative material, the opening having a pair of vertically opposing sidewalls that each meet a bottom of the opening, the bottom of the opening extending across the width of the opening and being disposed above the surface of the monocrystalline base;

a barrier material liner lining and in direct contact with the electrically insulative material along sidewalls and bottom of the opening, the barrier material comprising a member of the group consisting of TiN, Ta/Ru, Ta, and TiO;

a metal liner material over and directly contacting the barrier material liner along the sidewalls and bottom of the opening, the metal liner material being selected from the group consisting of tantalum alloyed with cobalt, tantalum allowed with cobalt and ruthenium, nitrogen in combination with cobalt, and nitrogen in combination with cobalt and ruthenium; and copper-containing material within the opening and directly against the metal liner material.

\* \* \* \* \*